United States Patent [19]

Boyer, III et al.

[11] Patent Number: 5,275,880
[45] Date of Patent: Jan. 4, 1994

[54] MICROWAVE ABSORBER FOR DIRECT SURFACE APPLICATION

[75] Inventors: Charles E. Boyer, III; Richard J. Kuo; Stephen M. Logiudice, all of St. Paul, Minn.

[73] Assignee: Minnesota Mining and Manufacturing Company, St. Paul, Minn.

[21] Appl. No.: 353,010

[22] Filed: May 17, 1989

[51] Int. Cl.$^5$ .................... B32B 5/16; B32B 7/12; H01B 1/02
[52] U.S. Cl. .................... 428/328; 428/338; 428/343; 342/1; 342/2; 342/3; 426/107
[58] Field of Search .................... 428/343, 328, 338; 342/1, 2, 3; 426/107

[56] References Cited

U.S. PATENT DOCUMENTS

| | | | |
|---|---|---|---|
| Re. 24,906 | 12/1960 | Ulrich | 206/59 |
| 3,007,160 | 10/1961 | Halpern | 343/18 |
| 3,240,621 | 3/1966 | Flower, Jr. et al. | 117/93.2 |
| 3,526,896 | 9/1970 | Wesch | 343/18 |
| 3,742,176 | 6/1973 | Ishino et al. | 219/10.55 |
| 3,806,928 | 4/1974 | Costanza | 343/18 A |
| 3,843,593 | 10/1974 | Shell et al. | 260/40 R |
| 3,865,627 | 2/1975 | Roden et al. | 117/240 |
| 3,866,009 | 2/1975 | Ishino et al. | 219/10.55 |
| 3,938,152 | 2/1976 | Grimes et al. | 343/18 A |
| 3,951,904 | 4/1976 | Tomonaga | 260/40 R |
| 4,001,827 | 1/1977 | Wallinet et al. | 343/18 A |
| 4,003,840 | 1/1977 | Ishino et al. | 252/62 |
| 4,024,318 | 5/1977 | Forster et al. | 428/519 |
| 4,034,375 | 7/1977 | Wallin | 343/18 A |
| 4,046,983 | 9/1977 | Ishino et al. | 219/10.55 |
| 4,116,906 | 9/1978 | Ishino et al. | 260/22 A |
| 4,153,661 | 5/1979 | Ree et al. | 264/120 |
| 4,173,018 | 10/1979 | Dawson et al. | 343/18 A |
| 4,243,500 | 1/1981 | Glennon | 204/159.12 |
| 4,256,828 | 3/1981 | Smith | 430/280 |
| 4,408,255 | 10/1983 | Adkins | 361/382 |
| 4,414,339 | 11/1983 | Solc et al. | 523/137 |
| 4,415,615 | 11/1983 | Esmay et al. | 428/40 |
| 4,538,151 | 8/1985 | Hatakeyama et al. | 343/18 A |
| 4,606,848 | 8/1986 | Bond | 252/511 |
| 4,612,242 | 9/1986 | Vesley et al. | 428/313.9 |
| 4,626,642 | 12/1986 | Wang et al. | 219/10.55 |
| 4,664,971 | 5/1987 | Soens | 428/288 |
| 4,690,778 | 9/1987 | Narumiya et al. | 252/506 |
| 4,785,148 | 11/1988 | Mayer | 219/10.55 |
| 4,814,546 | 3/1989 | Whitney et al. | 174/36 |
| 4,822,673 | 4/1989 | Umemura | 428/328 |
| 4,863,789 | 9/1989 | Arai | 428/343 X |
| 4,906,497 | 3/1990 | Hellmann et al. | 428/49 |
| 4,952,448 | 8/1990 | Bulloch et al. | 428/323 |
| 4,962,000 | 10/1990 | Emslander et al. | 426/107 X |
| 5,085,931 | 2/1992 | Boyer, III et al. | |

OTHER PUBLICATIONS

David L. Dye et al., "Theoretical Investigation of Fibers," Boeing Aerospace Company, Seattle, Washington, draft report for Department of Defense contract DAAK11-82-C-0152, 1983, pp. 3-5, 10-11, 13-19, 27-44, 101-111, 142-144.

"RAM Maintenance Procedures (Interim)," U.S. Navy, Oct. 1985.

Ruck et al., "Radar Cross Section Handbook," vol. 2, pp. 617-622, Section 8.3.2.1.1.3, Plenum Press 1970.

*Primary Examiner*—Daniel Zirker
*Attorney, Agent, or Firm*—Gary L. Griswold; Warren R. Bovee; Peter Forrest

[57] ABSTRACT

A layered microwave radiation absorber comprises an absorbing layer bound to one side of a conductive layer (such as a metallic plate or foil), and an adhesive layer bound on the other side of the conductive layer. The combination may be applied directly to the surface of any object, but especially to an existing conductive object coated with an nonconductive coating (such as paint) without removing the nonconductive coating from the surface. Several types of absorbing materials may be used, and other layers may be included. The absorber has superior resistance to delamination.

1 Claim, 2 Drawing Sheets

MICROWAVE ABSORBER FOR DIRECT SURFACE APPLICATION

TECHNICAL FIELD

This invention involves microwave radiation absorbers which are suitable for direct application to a surface, especially without significant prior surface preparation.

BACKGROUND

Microwave radiation absorbers typically are nonconductive composites of one or more kinds of dissipative particles dispersed through dielectric binder materials. The absorption performance of the composite absorber depends predominantly on the electromagnetic interactions of the individual particles with each other and with the binder. Thickness, weight, and ease of application of the composite absorber are important practical considerations. Thus, the mechanical properties of all portions of an absorber may be as important as the electromagnetic properties of the components.

SUMMARY OF INVENTION

The invention is a layered microwave radiation absorber comprising a layer of microwave radiation-absorbing material, a conductive layer, and an adhesive layer. The invention is suitable for direct application to any object, especially a conductive object having a nonconductive coating (typically paint). The direct application requires little or no removal or treatment of the surface of the object or nonconductive coating.

DETAILED DESCRIPTION

Figure 1:
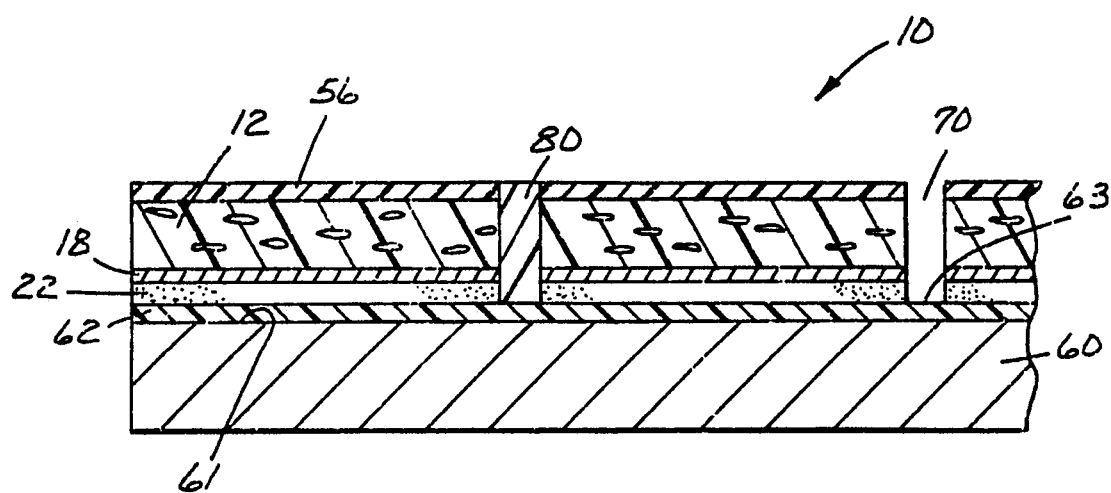
FIG. 1 is a sectional view of one embodiment of the invention, shown applied to a surface.

One embodiment of the invention is a layered absorber having three major components. In FIG. 1 three pieces of such a layered absorber 10 are shown in use on a conductive object 60. The layered absorber 10 is applied to an exposed surface 63 of a nonconductive coating 62. The nonconductive coating 62 is coated on a surface 61 of the conductive object 60.

The first component of the layered absorber 10 is a microwave radiation-absorbing layer 12. This layer 12 is applied to the radiation-incident side (in the figure, the upper side) of the second component, an electrically-conductive layer 18. The conductive layer 18 reflects microwaves which are not fully absorbed back into absorbing material 12 for further absorption. The combination of an absorbing material backed by a reflecting electrical conductor is sometimes known as a Dallenbach construction. The third component is an adhesive layer 22, applied to the other (i.e., nonradiation-incident) side of electrically-conductive layer 18. Also shown is a fourth but optional impedance matching layer 56 to be described later.

Absorbing layer 12 should absorb radiation over as broad an incident frequency range as possible, including the microwave region of approximately 2 to 20 GHz. Suitable absorbing materials 12 for this invention are composites of dissipative particles and dielectric binders.

More than one type of dissipative particle may be used in a single microwave absorber to tailor the absorption versus frequency characteristics to a particular application.

For example, the dissipative particles could be metal, graphite, carbon, or ferrite powders or particles, preferably those having an average size of about 3 microns (e.g., see U.S. Pat. No. 4,690,778). In another example, they could be conductive fibers of metals or alloys having lengths from 0.1 to 50 millimeters (100 to 50,000 microns) and aspect (length/diameter) ratios greater than ten (e.g., see U.S. Pat. No. 4,538,151). Or, the dissipative particles could be either solid or hollow spheres made from a dissipative material itself, or solid or hollow spheres made of glass or polymer and coated with dissipative material. Typical particle or coating materials are carbon or a metal such as iron. The particles may range in diameter from 0.1 to 150 microns (e.g., see U.S. Pat. No. 4,173,018), hence the names "microspheres" and "microbubbles," although the particles need not be exactly spherical.

Other preferred dissipative particles are acicular magnetic metallic filaments which have an average length of about 10 microns or less, diameters of about 0.1 micron or more, and aspect ratios between 50:1 and 10:1. Preferred materials are iron, nickel, cobalt and their alloys. The use of these filaments in an insulating microwave radiation absorber is taught in U.S. patent application No. 07/302,427 entitled "MICROWAVE ABSORBER EMPLOYING ACICULAR MAGNETIC METALLIC FILAMENTS," filed Jan. 26, 1989, assigned to the assignee of this application abandonded.

The dielectric binder may be ceramic, polymeric, or elastomeric. Ceramic binders are preferred for applications requiring exposure to high temperatures, while polymeric binders are preferred for their flexibility and lightness. Many polymeric binders are suitable, including polyethylenes, polypropylenes, polymethylmethacrylates, urethanes, cellulose acetates, epoxies, and polytetrafluoroethylene (PTFE). Suitable elastomeric binders are natural rubbers and synthetic rubbers, such as the polychloroprene rubbers known by the trade name "NEOPRENE" and those based on ethylene propylene diene monomers (EPDM).

To be effective, absorbing layer 12 should have a thickness in the direction of radiation propagation greater than about one-fortieth (2.5 percent) of the wavelength to be absorbed. For the microwave region of approximately 2 to 20 GHz, this implies a thickness greater than about 0.375 mm. Thicker layers generally provide greater absorption, but the increased weight and reduced flexibility are not desired in many applications. Thus, while layers having thicknesses up to one-fourth (25 percent) of the absorbed wavelength are possible, they are not as preferred. For example, in the microwave region this upper limit is about 37.5 mm, but sufficient absorption can be obtained with layers on the order of 2.0 mm or less in thickness.

Similarly, the absorbing layer 12 should have a reduced volume loading factor (absorbing particle volume as a percentage of total absorber volume) to produce a reduction in weight of the layered absorber 10. For example, volume loading factors for absorbing materials comprising carbonyl iron microspheres typically range from 40 to 65 percent, but those comprising acicular iron filaments as descried above have volume loadings which may be as low as 25 to 35 percent with no decrease in absorption performance, and thus are preferred.

A reduced volume loading factor also helps ensure that the absorbing layer 12 is an insulator, i.e., it has a high resistivity, despite the possible conductivity of the individual filaments. If the resistivity is too low, the absorbing layer 12 effectively becomes a conductive sheet, which reflects microwaves instead of absorbing them. The resistivity of iron, for example, is about $10^{-5}$ ohm-cm at room temperature. Insulators typically have resistivities of $10^{12}$ ohm-cm or more. Samples of the absorbing layer 12 having 25 percent volume loading of iron filaments had measured resistivities of approximately $1.5 \times 10^{13}$ ohm-cm at room temperature, indicating that they were insulators.

Any electrically-conductive material is suitable for the conductive layer 18.

Figure 2:
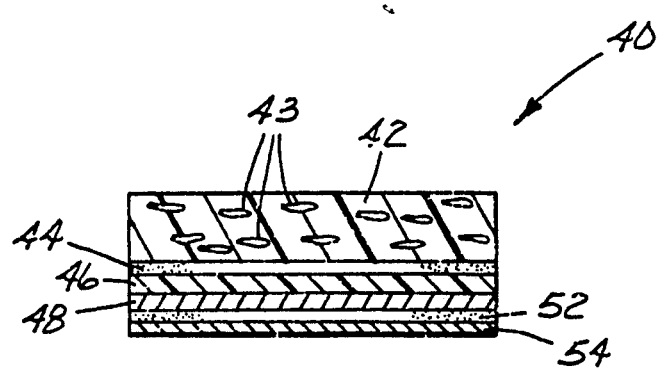
FIG. 2 is a sectional view of another embodiment of the invention.

FIG. 2 is a sectional view of another embodiment produced in the reduction of the invention to practice. In this embodiment, layered absorber 40 comprises microwave radiation-absorbing layer 42, which in turn comprises dissipative particles 43. The absorbing layer 42 is bound to an electrically-conductive layer 48 through two optional intermediate layers, an internal adhesive layer 44 and a support layer 46. The support layer 46 provides both convenience in handling a thin conductive layer 48 and a suitable surface for good adhesion by internal adhesive 44. The support layer 46 is not required if internal adhesive 44 adequately binds conductive layer 48 (regardless of thickness) to absorbing layer 42. Similarly, the internal adhesive 44 is not required if by any means the absorbing layer 42 binds sufficiently to the conductive layer 48. For example, the absorbing layer 42 could be cured directly onto the conductive layer 48. An external adhesive layer 52 is bound to the side of the conductive layer opposite that of the absorbing layer 42, and is protected by a release liner 54.

Many adhesive systems are suitable for the internal adhesive layer 44 (if used) or the external adhesive 52, depending on the application and choice of other materials in layered absorber 40. The specific adhesive system chosen must provide the requisite resistance to delamination (by internal adhesive 44 if used) and/or adhesion to a surface (by external adhesive 52), but it need not be in tape form or employ a release liner. For example, rubber resin adhesives, acrylic adhesives, silicone adhesives, and the like, may be used. Such adhesives are disclosed in, inter alia, U.S. Pat. Nos. Re. 24,906 (Ulrich); 4,256,828, (Smith); and 4,243,500, (Glennon).

One type of preferred adhesive is the acrylic pressure-sensitive adhesives. Such adhesives preferably comprise a copolymer containing 50-100 parts of substituted or unsubstituted alkyl acrylate or methacrylate monomers, ("acrylate monomer") and 0-50 parts of a polar copolymerizable monoethylenically-substituted monomer; the ratios being selected such that the adhesive will have the desired properties for the required application conditions. Useful acrylate monomers are monofunctional unsaturated acrylate esters of non-tertiary alkyl alcohols, the molecules of which have from 1 to about 14 carbon atoms. The polar copolymerizable monomers can be selected from strongly polar monomers such as acrylic acid, itaconic acid, hydroxyalkyl acrylates, cyanoalkyl acrylates, acrylamides or substituted acrylamides, or from moderately polar monomers such as N-vinyl pyrrolidone, N-vinyl caprolactam, acrylonitrile, and vinyl chloride.

A second type of adhesive system is preferred for use in layered absorbers which are adapted for application directly onto a surface which is not perfectly smooth, e.g., a bulkhead having rivet or bolt heads extending slightly above the surface. In such applications a preferred embodiment of the invention employs a compressible, foam-like, pressure-sensitive adhesive system for (at least) external adhesive layer 52. One example of such a compressible adhesive system is a monomer blend comprising glass or preferably polymeric microbubbles, in which the blend is used as a backing or core layer to support a pressure-sensitive adhesive layer. The thickness of the foam-like layer preferably ranges from 0.3 mm to about 4.0 mm. Also, the pressure-sensitive adhesive system may be a tape comprising coated glass microbubbles, as taught in U.S. Pat. No. 4,612,242 (Vesley et al.).

A third type of pressure-sensitive adhesive system comprises a compressible acrylic cellular pressure-sensitive adhesive membrane described in U.S. Pat. No. 4,415,615 (Esmay et al.), especially a system having a cellular structure providing at least 10 percent voids (on a volume basis), the average size of the voids being about 10 microns in diameter.

The external adhesive 52 need not be in direct contact with the conductive layer 48; e.g., an insulating layer may be added to help the layered absorber 40 survive extreme temperature changes. The dimensions, weight, and other properties of any material added to a layered absorber are considered in the complete design to achieve the desired absorption performance.

In general, a suitable release liner 54 (sometimes called a "backing sheet") is any flexible material which has a low-adhesion surface permitting it to be removed easily from the outermost side of the external adhesive 52 prior to installation.

Referring again to FIG. 1, the layered absorber 10 is especially useful for making an existing conductive object 60 which is covered with nonconductive material 62 absorptive of microwave radiation. Before the development of the present invention, one satisfactory installation procedure of an absorbing material required: (1) removal of the nonconductive coating 62 to expose the conductive object 60, and (2) application of the absorbing material with a separate adhesive, thus creating a Dallenbach construction (see U.S. Pat. No. 3,007,160) in which the exposed conductive object 60 served the role of conductive layer 18.

However, in practical applications this process required labor-intensive grinding, wire brushing or sanding to remove nonconductive coating 62 from conductive object 60, followed by removal of any remaining dust. To ensure that all dust was removed, a solvent or cleaning fluid was applied and removed, and any excess allowed to evaporate. Once exposed, the surface 61 oxidized rapidly, reducing both the reflectivity of the conductive object 60 and usually the effectiveness of the separate adhesive. Thus, either rust preventatives had to be applied and removed immediately before application of the adhesive, or subsequent application steps had to be carried out quickly, especially in corrosive environments such as outdoors or near saltwater. Working quickly on large surface areas was impracticable unless a large amount of manpower was employed and coordinated carefully. Some applications required several layers of adhesive to ensure adequate bonding. Finally, before the adhesive layer(s) lost tackiness, a conventional absorbing material was applied.

However, the layered absorber 10 may be directly applied to the exposed surface 63 in a single application step, with significantly less surface preparation than was necessary before, because the conductive layer 18 and the adhesive layer 22 are already present in the layered absorber 10 Thus, the time and labor required to remove the nonconductive coating 62 are eliminated, although the exposed surface 63 should be cleaned and dried for maximum adhesion by the external adhesive layer 22.

Individual pieces of the layered absorber 10 may not completely cover the surface of conductive object 60, leaving crevices 70 between two or more pieces of the layered absorber 10 as shown, or between a piece of the layered absorber 10 and any other object. This can allow corrosion of individual layers of the invention or the conductive object 60, which can cause premature delamination or removal of the layered absorber 10. Accurate sizing and placement of absorber pieces minimizes this problem, and a suitable sealant 80 should be used to prevent water and water vapor from penetrating any crevices 70.

The invention need not be in the form of a flat sheet which is applied to a flat surface, as shown in FIG. 1. For a cylindrical surface, for example, a pre-sized flexible cylindrical shell absorber is preferred to minimize possible stretching, cracking, or delamination of a flat layered sheet. The preformed cylindrical shell could be slit along its length, wrapped around the coated conductor (or slid along the long axis of the conductor) with little distortion, and then pressed into place. The seam formed by the edges of the slit may be sealed similarly to the sealing of the spaces between tiles, as described above.

In any embodiment of the invention, impedance matching of the absorbing layer to the incident medium (usually air) is preferred but not required. Impedance matching is done by a material which maximizes transmission of incident microwave radiation to the absorbing layer. In the embodiment of FIG. 1, an optional impedance-matching layer 56 is shown as a component of the layered absorber 10. The impedance-matching material 56 is bound to the radiation incident side of the absorbing material 12. The dimensions, weight, and other properties of an the impedance-matching layer 56 are considered in the design of complete layered absorber 10.

A suitable impedance-matching layer 56 is a layer of polymeric material having high volumes of trapped air, such as air-filled glass microbubbles embedded in the polymeric binder materials described above. For example, a suitable impedance-matching material comprises 5 to 25 volume percent uncoated hollow glass microbubbles (identified by Minnesota Mining and Manufacturing Company as type S60/10000 "SCOTCHLITE" brand glass bubbles), dispersed in synthetic rubber (such as that made from the EPDM resin identified by E.I du Pont de Nemours & Company as "NORDEL" brand type 1440).

The exact choices of materials, shapes, and application procedures depend on the final absorption versus frequency characteristics desired and the physical application required. The choices of materials also dictate the procedure and equipment required to assemble the absorber, as illustrated by the following examples.

Example 1

Stock Formulation "A" was made as follows. First, 52.49 grams of synthetic rubber ("NEOPRENE" brand type W as supplied by E.I. du Punt de Nemours & Company) was banded on a two roll mill and mixed for five minutes to reach an elastic phase. Then 0.52 grams of benzothiazyl disulfide, 13.12 grams of stearic acid, and 2.62 grams of white mineral oil were added, and mixing continued for another five minutes. After 147.38 grams of 50-200 micron long, 0.26 micron average diameter iron filaments were added, mixing continued until the average length of the filaments was approximately 6.5 microns. Mixing did not change the average diameter of approximately 0.26 microns, thus the filaments had aspect ratios of 25:1. Next a curing accelerator, comprising 0.26 grams of hexamethylene-tetramine, 0.26 grams of tetramethylthiuramdisulfide, and 0.52 grams of polyethylene glycol, was mixed into the iron filament/binder mixture to produce the stock formulation. The volume loading of the filaments into the binder was determined to be 35 percent. To reduce premature cure, the stock formulation was kept below 30° C.

Sample A was constructed according to the design of FIG. 2. A calipered layer of a radiation absorber 42, 1.2 millimeters thick and comprising the iron filaments 43, was made from Stock Formulation A. A polyester support layer 46 was adhered to the absorbing layer 42 by an ethylene acrylic acid (EAA) type internal adhesive 44. The EAA adhesive resin was "PRIMACOR" brand 3330 supplied by Dow Chemical Company. The support layer 46 supported an aluminum conductive layer 48 which was vapor coated on the side of the support layer 46 not in contact with the absorbing material 42. An external adhesive layer 52, a 1.143 mm thick double-sided pressure-sensitive acrylic adhesive tape supplied by Minnesota Mining and Manufacturing Company (3M) under the designation "SCOTCH VHB" brand No. Y4950, was applied to the aluminum conductive layer 48. A silicone-treated paper release liner 54 protected the other side of the external adhesive layer 52 until use.

In Sample B, 0.0085 mm thick aluminum foil was used for the conductive layer 48, and was thick enough to be adhered directly, without a polyester support layer 46, to an absorbing sheet 42 having the same composition as Sample A.

Example 2

Another example of the invention was made according to the general design of FIG. 2, as follows. First, a 1.3 mm thick square, 165 mm on each side, layer of an absorbing material 42 was obtained. The absorbing material was that identified by Plessey Microwave Company as HP Series Single Layer. This material comprised magnetic carbonyl iron particles 43 dispersed in a silicone binder. The iron dissipative particles 43 were generally spherical, and ranged in diameter from about 1 to 10 microns, typically about 5 microns. Then, to construct Sample C, a 0.089 mm thick layer of a thermoplastic EAA type internal adhesive 44 (Dow Chemical Company "PRIMACOR" brand type 3330) was coated on one side of a 0.0085 mm thick aluminum conductive layer 48; no support layer 46 was required. The adhesive-coated conductive layer 48 was bound to the absorbing layer 42 by heat lamination at 150° C. After cooling to room temperature, 3M "SCOTCH VHB" brand No. Y4950 adhesive tape was applied to the exposed, non-laminated side of the aluminum conductive layer 48. A silicone-treated paper release liner 54 protected the other side of external adhesive layer 52.

Figure 3:
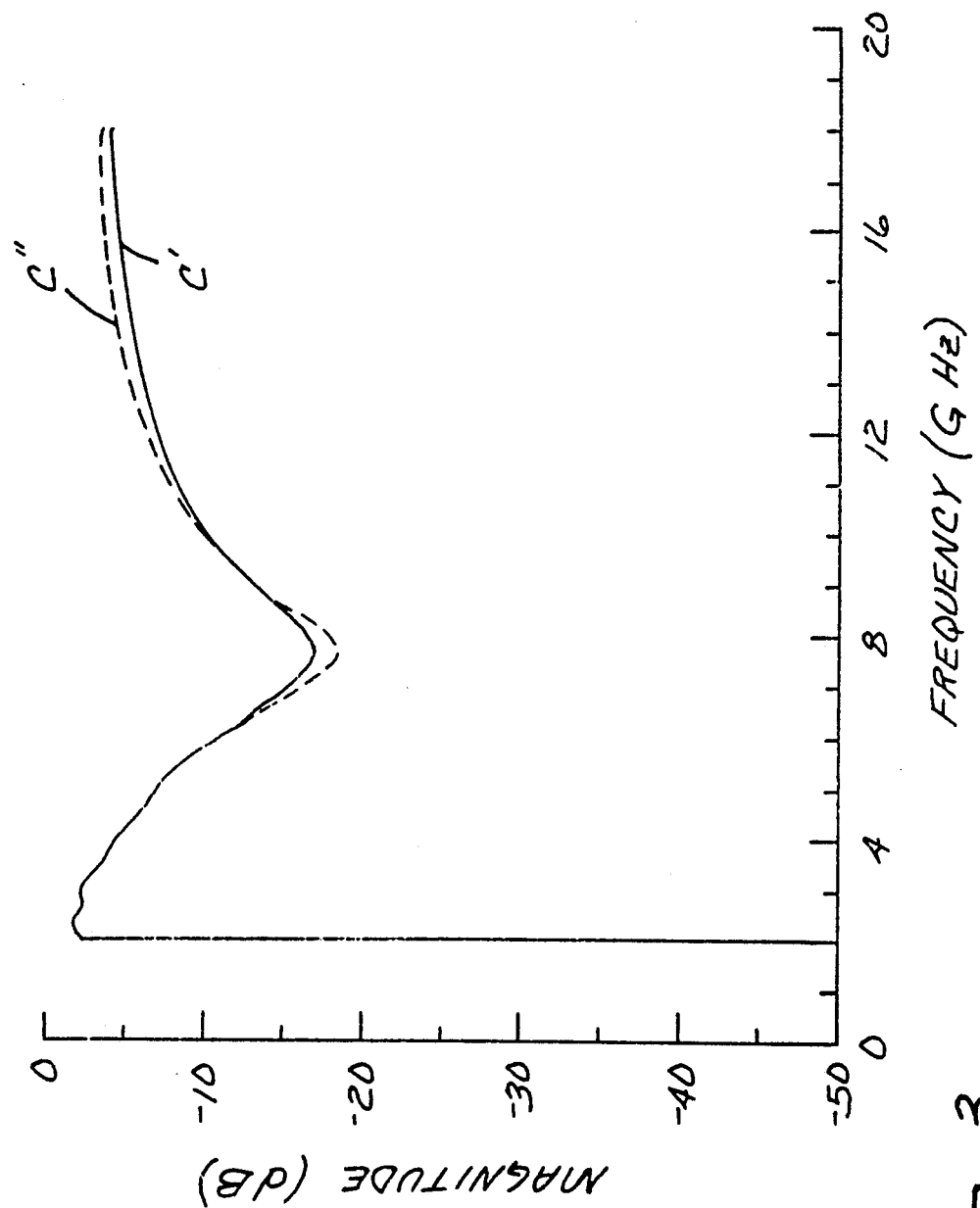
FIG. 3 is a graph of the actual absorption response of a radiation-absorbing material before and after incorporation into an embodiment of the invention.

After the release liner 54 was removed, the layered absorber 40 was adhered directly onto a metal base plate serving as a conductive surface, and microwave absorption measurements were made. For comparative measurements, a square sample of an absorbing material identical to the absorbing layer 42 only, 165 millimeters on each side, was simply laid on a 165 millimeter square metal plate. In each case, the absorption of transverse electric (TE) mode radiation, from 2 to 18 GHz, at a 5° angle of incidence, is graphed in FIG. 3.

The absorption of the absorbing material 42 only is designated C', and the similar absorption of the layered absorber 40 is designated C''. The absorption of the present invention is slightly improved over that of solely the absorbing material 42 in a band about 2 GHz wide, centered on the resonant frequency of about 7.5 GHz. This is believed to be due to the strong adhesion of the absorbing material 42 to the conductive layer 48, as opposed to the mere placement (without adhesive) of the absorbing material 42 onto the metal base plate. Simply placing the absorbing material 42 onto the metal base plate can allow slight air gaps between the two materials to affect the absorption performance.

Example 3

A layered absorber is suitable for permanent application if it remains intact and resists peeling from a surface when subjected to a pulling force of at least 2.0 Newtons per centimeter of width (measured transversely to the direction of force), preferably at least 14N/cm. Thus, each interface between individual layers within a layered absorber should show resistance to delamination of this value or more; the adhesion of the layered absorber to the surface should exceed this value for permanent application, or be less for removable applications. To demonstrate the integrity of each layer of the inventive absorber, delamination tests of individual pairs of layers were performed.

First, 3M "SCOTCH VHB" brand No. Y4950 adhesive tape was adhered to a painted metal plate. The paint was a nonconductive silicone-based enamel paint identified by the U.S. Navy as TTP490. In a first 180° peel test according to ASTM D-903, the foam tape substrate came apart, without adhesive failure, at 87.6N/cm.

Second, a piece of 3M "SCOTCH VHB" brand No. Y4950 adhesive tape was adhered to 0.0085 mm thick aluminum foil. T-peel tests were made according to ASTM D-1876-72, except that the pulling speed was 305 mm/min instead of 254 mm/min. At least 43.8N/cm of peeling force was required to overcome the adhesion. Adhesion was qualitatively observed to improve over an interval of about one month.

Third, Stock Formulation "D" was prepared from four sub-mixtures, or "charges." Charge D1 comprised 111.51 grams of synthetic rubber resin ("NORDEL" brand ethylene propylene diene monomer resin type 1440 as supplied by E.I. du Pont de Nemours & Company), banded on a two roll mill at room temperature, then mixed for five minutes to reach an elastic phase. Charge D2 comprised 438.75 grams of 50-200 micron long iron filaments. Charge D2 was mixed into Charge D1 in six increments over seventy minutes, reducing the lengths of the iron filaments as in Example 1. Charge D3 comprised 1.45 grams of 1,2-dihydrotrimethyl quinoline polymer ("AGERITE" brand type MA by R. T. Vanderbilt Company), 66.9 grams of tetrabromophthalate ester (type DP 45 by Great Lakes Chemical Corporation), 5.58 grams of 1,3-butylene glycol dimethacrylate (type SR 297 by Atlantic Richfield Company), and 8.36 grams of antimony trioxide (type KR by Amspec Chemical Company). Charge D3 was added to the mixture of Charges D1 and D2 in three increments over sixty minutes. Charge D4 comprised 13.38 grams of bis(tert-butylperoxy-isopropyl)benzene ("VULCUP" brand type 40KE by Hercules Chemical Company) and 3.35 grams of paraffinic oil ("SUNPAR" brand type 2280 by Sun Oil Company). Charge D4 was added to the mixture of Charges D1-D2-D3 and the product milled for five minutes.

A thin sheet of the milled product was stripped off the two roll mill and rolled tightly into a cylindrical roll. A section was cut, pressed into a 1 mm thick layer, and cured at 150° C. for thirty minutes. The cured layer was adhered to a 0.0085 mm aluminum layer with Dow Chemical Company "PRIMACOR" brand type 3330 EAA type adhesive. T-peel tests, at 305 mm/min instead of 254 mm/min, showed 70.0N/cm was required to overcome the adhesion between the absorber layer and the aluminum layer.

Example 4

The environmental stability of several embodiments of the invention was tested. Four square pieces of layered absorber, each 165 mm on a side and 1.3 mm in thickness, were made. Three pieces (Sample E) were made as in Example 3, i.e., an absorbing material made from Stock Formulation C was thermally bonded at 150° C. to one side of a 0.0084 mm thick aluminum foil with a 0.089 mm thick layer of Dow Chemical "PRIMACOR" brand 3330 thermoplastic EAA type adhesive, and 3M "SCOTCH VHB" brand No. Y4950 adhesive tape was applied to the other side of the foil. A fourth piece (Sample F) was made according to the same design, except that it comprised a 1.3 mm thick sample of Plessey Microwave Company HP Series Single Layer absorber, bonded to the aluminum foil with an 0.0519 mm thick layer of type Y9732 adhesive from Minnesota Mining and Manufacturing Company.

Each Sample was adhered to an aluminum surface painted with U.S. Navy type TTP490 paint by removing the release liner from the Y4950 tape and pressing the Sample in place. Then each Sample was exposed to a salt fog environment according to MIL-STD-810D Method 509.2, except that the temperature in the salt spray cabinet was 39.4° C. instead of 36.7° C. The salt concentration was 5 percent and the exposure was for 48 hours.

The Y4950 adhesive tape of each Sample did not failure of adhesives between individual layers of any Sample observed. Ten very small spots of corrosion, each less than 1 mm in diameter, appeared on the surface of Sample F. Typically three such spots of corrosion were on the surface of each of the three Sample E absorbers.

Microwave absorption measurements were made before and after exposure to the salt fog environment. For incident transverse electric (TE) mode radiation at 5° incidence angle, Sample F showed, both before and after the salt fog exposure, at least 5dB absorption from 4 to 14 GHz, and maximum absorption of 17 dB at about 7.5 GHz. For the same incident radiation, one of the Sample E tiles showed, both before and after the salt fog exposure, at least 5 dB absorption from 5.5 to 16 GHz, and maximum absorption of 10 dB at about 8 GHz. Generally the measurements made before and after exposure differed from each other by 2 dB or less at any frequency measured.

Tests were performed on similarly constructed samples of each individual layer interface, both before and after exposure to the salt fog. In a 180° peel test (ASTM D-903), 28N/cm of force was required to peel the adhesive tape from the painted metal plate after exposure, as opposed to 36.8N/cm before exposure. In a T-peel test (ASTM D-1876-72, 305 mm/min pulling speed), 20.6N/cm of force was required to separate the adhesive tape from the aluminum foil after exposure, as opposed to 15.8N/cm before exposure. In similar T-peel tests, 2.4N/cm of force was required to peel the aluminum foil from the Sample F absorber layer after exposure, as opposed to 2.3N/cm of force before exposure. However, the adhesion between the aluminum foil and the Sample E absorber layer was too strong, either before exposure or after, to allow a quantitative measurement to be made, indicating a strength well in excess of the desired 2.0 N/cm.

We claim:

1. A layered microwave radiation absorber for application to a separate surface, the absorber comprising a layer of non-electrically-conductive microwave radiation absorbing material bound to a first side of an electrically conductive radiation reflecting layer, and an adhesive layer bound to a second side of the integral electrically conductive radiation reflecting layer, having a resistance to delamination at any interface between two layers of at least 2.0 Newtons of force per centimeter of width, the microwave radiation absorbing material comprising acicular magnetic metallic filaments having an average length of about 10 microns or less, diameters of about 0.1 micron or more, and aspect rations between 50:1 and 10:1.

* * * * *